United States Patent
Yu et al.

(10) Patent No.: US 12,380,919 B2
(45) Date of Patent: Aug. 5, 2025

(54) TUNNELING DEVICE HAVING INTERMEDIATE LAYER USING NATURAL OXIDE FILM AND METHOD OF MANUFACTURING TUNNELING DEVICE

(71) Applicant: Korea University Research and Business Foundation, Seoul (KR)

(72) Inventors: Hyun Yong Yu, Seoul (KR); Kyu Hyun Han, Seoul (KR)

(73) Assignee: Korea University Research and Business Foundation, Seoul (KR)

( * ) Notice: Subject to any disclaimer, the term of this patent is extended or adjusted under 35 U.S.C. 154(b) by 0 days.

(21) Appl. No.: 17/909,055

(22) PCT Filed: Jun. 7, 2021

(86) PCT No.: PCT/KR2021/007067
§ 371 (c)(1),
(2) Date: Sep. 2, 2022

(87) PCT Pub. No.: WO2022/181889
PCT Pub. Date: Sep. 1, 2022

(65) Prior Publication Data
US 2023/0112348 A1    Apr. 13, 2023

(30) Foreign Application Priority Data
Feb. 26, 2021 (KR) ........................ 10-2021-0026173

(51) Int. Cl.
*G11B 5/39* (2006.01)
*H01L 21/02* (2006.01)
*H01L 21/027* (2006.01)

(52) U.S. Cl.
CPC ...... *G11B 5/3909* (2013.01); *H01L 21/02568* (2013.01); *H01L 21/0272* (2013.01)

(58) Field of Classification Search
CPC ............ G11B 5/3909; H01L 21/02568; H01L 21/0272
See application file for complete search history.

(56) References Cited

U.S. PATENT DOCUMENTS 9,269,775 B2    2/2016   Choi et al.
9,472,396 B2    10/2016  Khondaker et al.
(Continued)

FOREIGN PATENT DOCUMENTS

CN        111863935 A  * 10/2020   ............... G01D 5/14
JP     WO2012/023252 A1    2/2012
(Continued)

OTHER PUBLICATIONS

Buapan et al. ("Versatile, Low-cost, and Portable 2D Material Transfer Setup with a Facile and Highly Efficient DIY Inert-Atmosphere Glove Compartment Option", ACS Omega, 6, 17952-17964, 2021, published in Jul. 7, 2021. (Year: 2021).*
(Continued)

*Primary Examiner* — Jay C Kim
*Assistant Examiner* — Woo K Lee
(74) *Attorney, Agent, or Firm* — NSIP Law

(57) ABSTRACT

A tunneling device includes a first semiconductor portion disposed on a first oxide substrate, a second semiconductor portion disposed on the first semiconductor portion, and an intermediate layer disposed between the first semiconductor portion and second semiconductor portion. The intermediate layer is a natural oxide film obtained by naturally oxidizing one surface of the second semiconductor portion for a predetermined time.

2 Claims, 6 Drawing Sheets

(56) References Cited

U.S. PATENT DOCUMENTS

| | | | |
|---|---|---|---|
| 10,483,300 | B2 | 11/2019 | Lim et al. |
| 2015/0014630 | A1* | 1/2015 | Choi ........................ H01L 29/88 |
| | | | 438/299 |
| 2015/0294875 | A1 | 10/2015 | Khondaker et al. |
| 2016/0240692 | A1* | 8/2016 | Shepard .............. H01L 21/0262 |
| 2018/0350852 | A1 | 12/2018 | Lim et al. |
| 2020/0350442 | A1* | 11/2020 | Jo ......................... H01L 29/882 |

FOREIGN PATENT DOCUMENTS

| | | |
|---|---|---|
| KR | 10-2012-0110797 A | 10/2012 |
| KR | 10-2015-0008770 A | 1/2015 |
| KR | 10-2017-0109457 A | 9/2017 |
| KR | 10-2017-0109461 A | 9/2017 |
| KR | 10-1805827 B1 | 1/2018 |
| KR | 10-2018-0132503 A | 12/2018 |
| KR | 10-2019-0017515 A | 2/2019 |
| KR | 10-2100415 B1 | 4/2020 |
| KR | 10-2020-0114797 A | 10/2020 |
| KR | 10-2021-0006164 A | 1/2021 |
| KR | 10-2239885 B1 | 4/2021 |
| KR | 10-2277139 B1 | 7/2021 |
| WO | WO 2017/164617 A1 | 9/2017 |

OTHER PUBLICATIONS

Buapan et al., "Versatile, Low-cost, and Portable 2D Material Transfer Setup with a Facile and Highly Efficient DIY Inert-Atmosphere Glove Compartment Option", ACS Omega, 6, 17952-17964, 2021 (Year: 2021).*

Frisenda, Riccardo, et al. "Recent progress in the assembly of nanodevices and van der Waals heterostructures by deterministic placement of 2D materials." *Chemical Society Reviews* vol. 47. Issue 1 (2018). pp. 52-68.

* cited by examiner

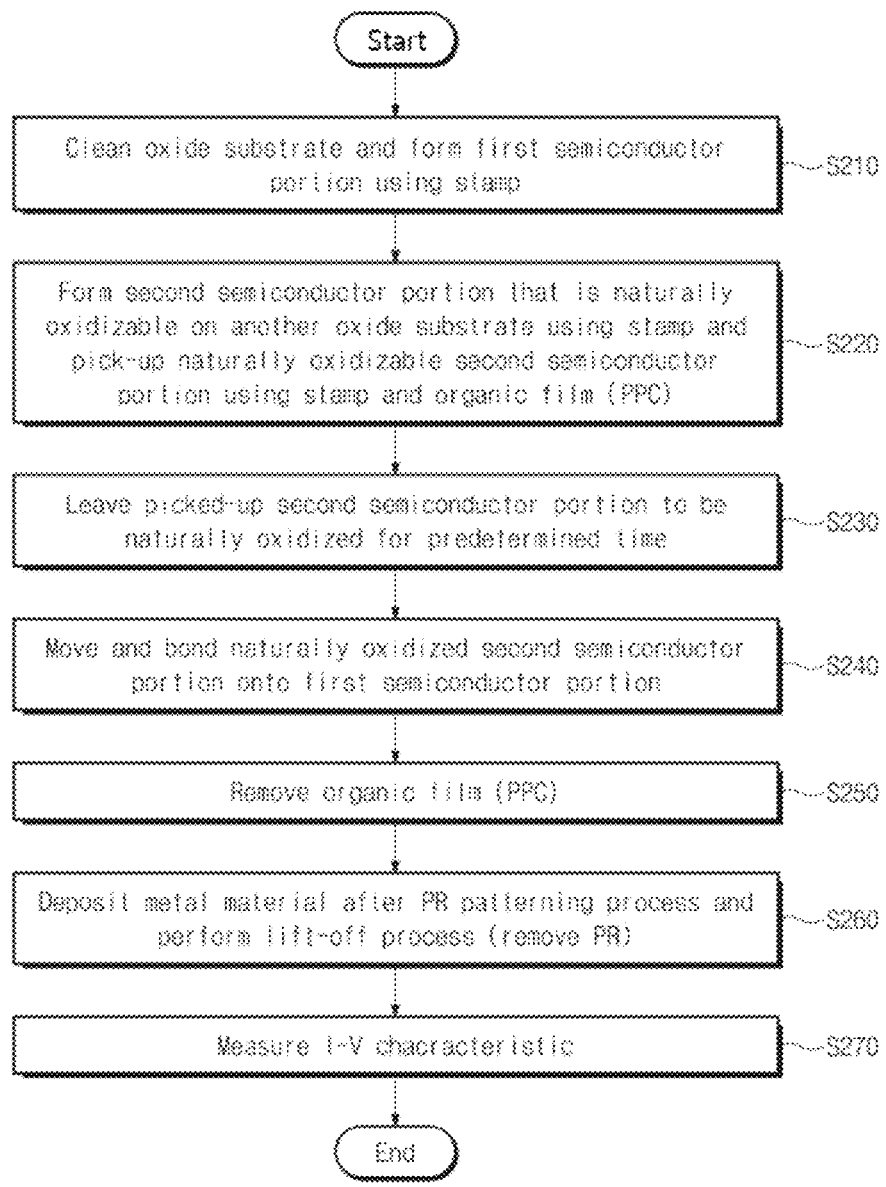

TUNNELING DEVICE HAVING INTERMEDIATE LAYER USING NATURAL OXIDE FILM AND METHOD OF MANUFACTURING TUNNELING DEVICE

CROSS REFERENCE TO RELATED APPLICATIONS

This application is a U.S. National Stage Application of International Application No. PCT/KR2021/007067, filed on Jun. 7, 2021, which claims the benefit under 35 USC 119(a) and 365(b) of Korean Patent Application No. 10-2021-0026173 filed on Feb. 26, 2021, in the Korean Intellectual Property Office, the entire disclosures of which are incorporated herein by reference for all purposes.

BACKGROUND

1. Field of Disclosure

The present disclosure relates to a method of manufacturing a tunneling device having an intermediate layer using a natural oxide film.

2. Description of the Related Art

Recently, researches on a variety of devices based on a transition metal dichalcogenide, such as $MoS_2$, $WS_2$, $MoTe_2$, $MoSe_2$, $ReS_2$, $ReSe_2$, $HfS_2$, BP, etc., which is a two-dimensional (2D) semiconductor material spotlighted as a new semiconductor material to replace silicon in the future, are being actively progressed. In particular, active researches are being conducted in fields such as negative differential resistance devices, resonant tunneling devices, and tunneling FETs using a tunneling phenomenon through a heterostructure in which 2D semiconductor materials are bonded to each other.

Since tunneling devices based on the 2D semiconductor heterostructures have superior atomic sharpness at an interface than those manufactured through heterostructures such as Si, Ge, SiGe, and GaAs (groups III-V), which are used to manufacture conventional tunneling devices, the decrease in device performance due to an interfacial trap is very small, and it is getting a lot of attention. Particularly, some tunneling devices are receiving lots of attention since it is possible to implement a negative differential resistance with high PVCR (peak to valley ratio) by inserting an insulating material into between same 2D semiconductor materials or between different 2D semiconductor materials as a tunneling layer.

SUMMARY

The present disclosure provides a method of manufacturing a tunneling device to reduce a manufacturing time of the tunneling device.

Embodiments of the inventive concept provide a tunneling device including a first semiconductor portion disposed on a first oxide substrate, a second semiconductor portion disposed on the first semiconductor portion, and an intermediate layer disposed between the first semiconductor portion and second semiconductor portion. The intermediate layer is a natural oxide film obtained by naturally oxidizing one surface of the second semiconductor portion for a predetermined time.

The first semiconductor portion is formed on the first oxide substrate using a stamp, and the second semiconductor portion is stacked on the first semiconductor using the stamp and an organic film while being disposed on a second oxide substrate different from the first oxide substrate.

The stamp is a polydimethylsiloxane (PDMS), and the organic film is a propylene carbonate (PPC).

The first semiconductor portion includes one of transition metal dichalcogenide materials of an MX2 molecular structure series.

The transition metal dichalcogenide materials are one of $MoS_2$, $WSe_2$, $MoTe_2$, $WS_2$, $MoSe_2$, $ReS_2$, $ReSe_2$, and $WTe_2$.

The second semiconductor portion is a material that is naturally oxidized within about 15 minutes.

The second semiconductor portion includes one of $HfS_2$, $MoS_2$, BP, $HfSe_2$, $HfTe_5$, $HfTe_2$, $ZrS_2$, $ZrSe_2$, $ZrTe_2$, $ZrS_3$, $ZrS_5$, and $ZrTe_3$.

The intermediate layer has a thickness between about 1 nanometer and about 2 nanometers.

Embodiments of the inventive concept provide a method of manufacturing a tunneling device. The method includes forming a first semiconductor portion on a first oxide substrate using a stamp, forming a second semiconductor portion on a second oxide substrate using the stamp, picking up the second semiconductor portion using an organic film, leaving the second semiconductor portion for a predetermined time to naturally oxidize one surface of the second semiconductor portion to form a natural oxide film, bonding the naturally oxidized second semiconductor portion with an upper portion of the first semiconductor portion, removing the organic film, performing a photoresist patterning process to deposit a metal material on the first and second semiconductor portions bonded with each other on the upper portion of the first oxide substrate, and performing a lift-off process to remove the patterned photoresist.

An I-V characteristic is measured after the lift-off process to measure negative differential resistance characteristics.

The natural oxide film is formed as an intermediate layer when the naturally oxidized second semiconductor portion is bonded with the upper portion of the first semiconductor portion.

According to the manufacturing method of the tunneling device, defects occurring at an interface of the semiconductor are greatly reduced, and the tunneling device is able to be manufactured within a short period of time without decreasing performance thereof.

BRIEF DESCRIPTION OF THE DRAWINGS

The above and other advantages of the present disclosure will become readily apparent by reference to the following detailed description when considered in conjunction with the accompanying drawings wherein:

FIG. 4 is a flowchart of a method of manufacturing a tunneling device according to an embodiment of the present disclosure.

DETAILED DESCRIPTION

Figure 1A:
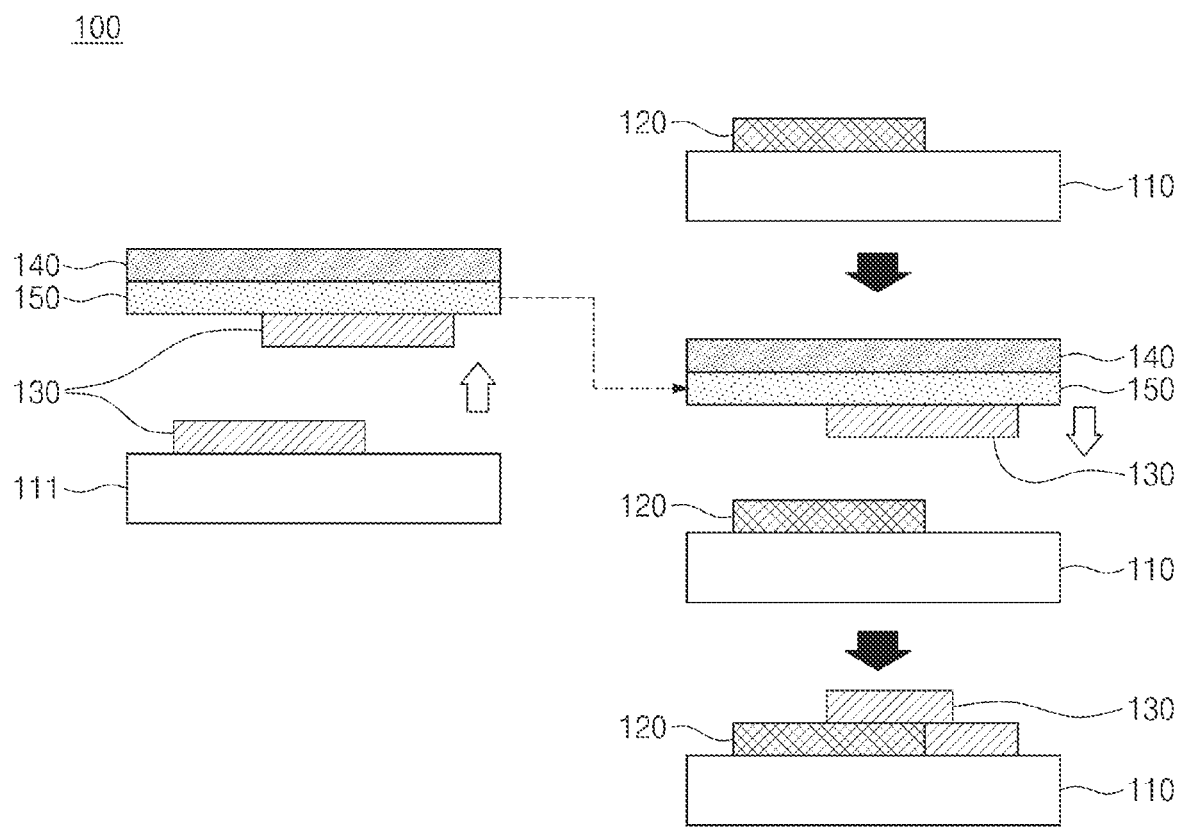
FIG. 1A is a view of a first process of a manufacturing process of a tunneling device according to an embodiment of the present disclosure.

The present disclosure relates to a technology of manufacturing a high-efficiency tunneling device to which a technique of bonding a semiconductor material having a natural oxide film with another semiconductor material is applied and from which a process of inserting an intermediate layer insulator, which is essential for a conventional tunneling device, is omitted.

In the tunneling device related to the present disclosure, a negative differential resistance is implemented by inserting a thin insulating material in which a tunneling is able to be realized into between the same materials or between different semiconductor materials to form a 2D semiconductor/an insulator intermediate layer/a 2D semiconductor structure and by controlling electron tunneling through a band gap due to gate and drain voltages and a position change of Fermi level.

Hereinafter, embodiments of the present disclosure will be described with reference to accompanying drawings. The present disclosure may be variously modified and realized in many different forms, and thus specific embodiments will be exemplified in the drawings and described in detail hereinbelow. However, the present disclosure should not be limited to the specific disclosed forms, and be construed to include all modifications, equivalents, or replacements included in the spirit and scope of the present disclosure. Like numerals refer to like elements throughout.

It will be understood that, although the terms "first," "second," etc. may be used herein to describe various elements, these elements should not be limited by these terms. For example, the above expressions do not limit the sequence and/or importance of the corresponding elements. These terms are only used to distinguish one element from another. For example, a first element could be termed a second element, and, similarly, a second element could be termed a first element, without departing from the scope of the present disclosure.

FIG. 1A is a view of a first process of a manufacturing process of a tunneling device according to an embodiment of the present disclosure.

Referring to FIG. 1A, the tunneling device 100 of the first process of the manufacturing process may include a first oxide substrate 110, a second oxide substrate 111, a first semiconductor portion 120, an h-BN insulator portion 130, a stamp 140, and an organic film 150.

The first oxide substrate 110 and the second oxide substrate 111 may be formed of oxide such as silicon oxide ($SiO_2$) or nitride such as silicon nitride ($SiN_x$) as a gate oxide. In addition, the first oxide substrate 110 and the second oxide substrate 111 may be formed of a high-k dielectric material with a high dielectric constant. For instance, the first oxide substrate 110 and the second oxide substrate 111 may include hafnium oxide ($HfO_2$), hafnium silicon oxide ($HfSiO_4$), lanthanum oxide ($La_2O_3$), lanthanum aluminum oxide ($LaAlO_3$), zirconium oxide ($ZrO_2$), zirconium silicon oxide ($ZrSiO_4$), tantalum oxide ($Ta_2O_5$), titanium oxide ($TiO_2$), strontium titanium oxide ($SrTiO_3$), yttrium oxide ($Y_2O_3$), aluminum oxide ($Al_2O_3$), red scandium tantalum oxide ($PbSc_{0.5}T_{0.5}aO_3$), or red zinc niobate ($PbZnNbO_3$).

In addition, the first oxide substrate 110 and the second oxide substrate 111 may be formed of metal nitride oxide such as aluminum oxynitride (AlON), zirconium oxynitride (ZrON), hafnium oxynitride (HfON), lanthanum oxynitride (LaON), yttrium oxynitride (YON), silicates thereof, or aluminates thereof. The silicates or aluminates may be, for example, ZrSiON, HfSiON, LsAiON, YsiON, ZrAlON, HfAlON, or the like.

Further, the first oxide substrate 110 and the second oxide substrate 111 may be formed of perovskite-type oxides, a niobate or tantalate system material, a tungsten-bronze system material, a Bi-layered perovskite system material, or the like.

The first semiconductor portion 120 may be manufactured on the first oxide substrate 110 using the stamp 140.

In this case, the first semiconductor portion 120 may be a 2D semiconductor and may include transition metal dichalcogenide materials of an $MX_2$ molecular structure series such as $MoS_2$, $WSe_2$, $MoTe_2$, $WS_2$, $MoSe_2$, $ReS_2$, $ReSe_2$, $HfS_2$, BP, $WTe_2$, etc. However, the present disclosure should not be limited thereto or thereby.

The h-BN insulator portion 130 may be formed on the second oxide substrate 111 using the stamp 140.

The first semiconductor portion 120 may be formed on the first oxide substrate 110 and the h-BN insulator portion 130 may be formed on the second oxide substrate 111 using the stamp 140.

In the present embodiment, the stamp 140 may be fabricated by a conventional fashion as understood by those skilled in the art. For example, the stamp 140 may be fabricated by molding and curing a layer of a material on a master having a surface presenting a relief form (that is in opposite of a stamp relief structure). The stamp 140 may be cured by exposure to actinic radiation, heating, or combinations thereof. The stamp 140 thus may include a layer of an elastomeric material, which may be referred to as an elastomeric layer, cured layer, or cured elastomeric layer. The stamp may also, for example, be fabricated by ablating or engraving a material as a manner that generates the relief structure. The relief structure of the stamp may have a shape in which a raised surface has a height from a recessed surface enough to allow the raised surface to selectively contact with a substrate.

The stamp 140 may be formed of an elastomeric material to allow at least convex portions of the stamp to conform to a surface of the substrate to facilitate full transfer of a mask material to the substrate. Polymeric materials may be suitable to form the elastomeric stamp and may include, but not limited to, for example, silicone polymers, such as polydimethylsiloxane (PDMS); polymers of conjugated diolefin hydrocarbons, including epoxy polymers, polyisoprene, 1,2-polybutadiene, 1,4-polybutadiene, and butadiene/acrylonitrile; elastomeric block copolymers of an A-B-A type block copolymer, where A represents a non-elastomeric block, preferably a vinyl polymer and most preferably polystyrene, and B represents an elastomeric block, preferably polybutadiene or polyisoprene; acrylate polymers; and fluoropolymers. Examples of A-B-A block copolymer may include, but not limited to, poly(styrene-butadiene-styrene) and poly (styrene-isoprene-styrene). The polymeric material may be an elastomeric material or may become the elastomeric material upon curing.

In the manufacturing process of the tunneling device according to an embodiment of the present disclosure, the stamp 140 may be a PDMS (polydimethylsiloxane) stamp.

The organic film 150 may be a propylene carbonate (hereinafter, referred to as PPC) film and may be bonded with the PDMS stamp 140 to pick-up the first semiconductor portion 120 formed on the first oxide substrate 110 and the h-BN insulator portion 130 formed on the second oxide substrate 111.

First, according to an embodiment, the first semiconductor portion 120 may be formed on the first oxide substrate 110 using the stamp 140. Then, the h-BN insulator portion 130 formed on the second oxide substrate 111 using the stamp 140 may be pick-up using the stamp 140 and the organic film 150.

In this case, the picked-up h-BN insulator portion 130 may be separated from the second oxide substrate 111.

The h-BN insulator portion 130 separated from the second oxide substrate 111 by the pick-up process and being in contact with the organic film 150 may be bonded with the first semiconductor portion 120 formed on the first oxide substrate 110.

Accordingly, the first semiconductor portion 120 and the h-BN insulator portion 130 may be stacked on the first oxide substrate 110.

After the first semiconductor portion 120 and the h-BN insulator portion 130 are stacked, the organic film 150 that is in contact with the h-BN insulator portion 150 may be removed.

Figure 1B:
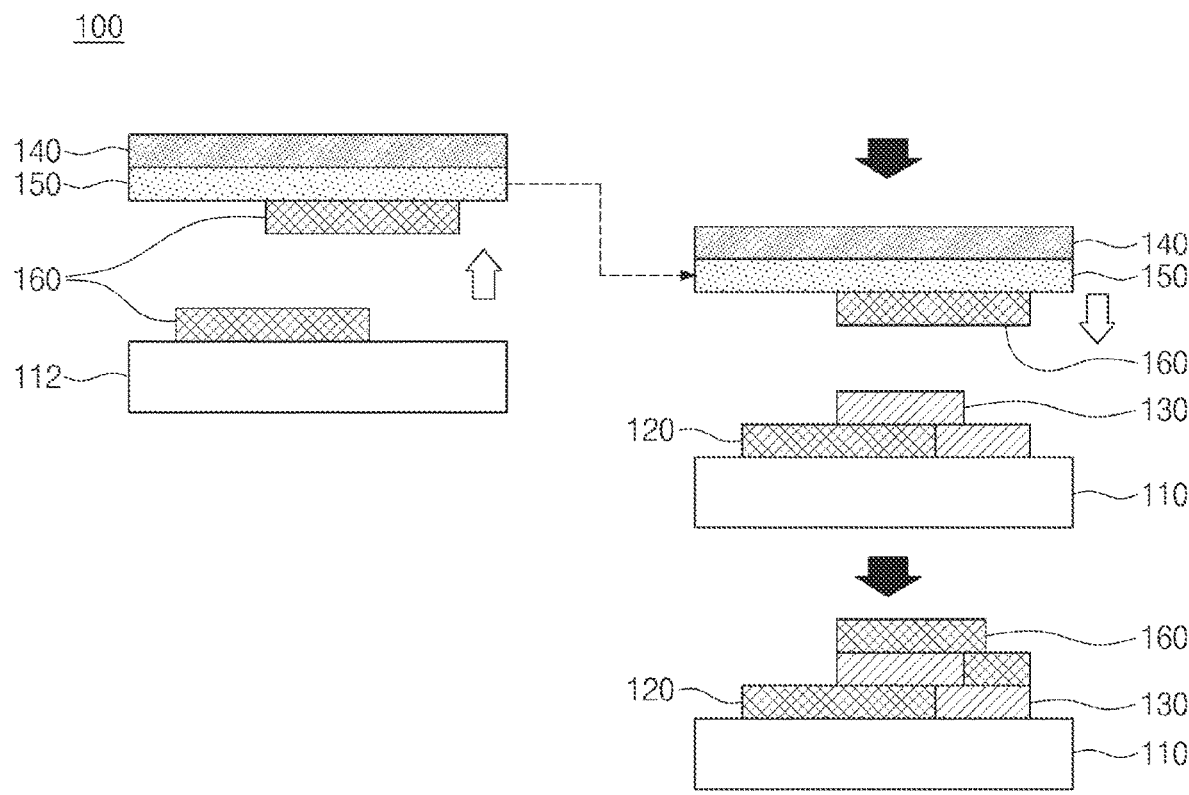
FIG. 1B is a view of a second process of the manufacturing process of a tunneling device according to an embodiment of the present disclosure.

FIG. 1B is a view of a second process of the manufacturing process of the tunneling device according to an embodiment of the present disclosure.

Referring to FIG. 1B, the tunneling device 100 may further include a third oxide substrate 112 and a second semiconductor portion 160.

The third oxide substrate 112 may include the same material as the first oxide substrate 110 and the second oxide substrate 111.

The second semiconductor portion 160 may be manufactured on the third oxide substrate 112 using the stamp 140.

In the present embodiment, the second semiconductor portion 160 may be a 2D semiconductor and may include transition metal dichalcogenide materials of an MX2 molecular structure series such as $MoS_2$, $WSe_2$, $MoTe_2$, $WS_2$, $MoSe_2$, $ReS_2$, $ReSe_2$, $HfS_2$, BP, $WTe_2$, etc., however, the present disclosure should not be limited thereto or thereby.

The second semiconductor portion 160 manufactured on the third oxide substrate 112 using the stamp 140 may be picked-up by the stamp 140 and the organic film 150.

In this case, the picked-up second semiconductor portion 160 may be separated from the third oxide substrate 112.

The second semiconductor portion 160 separated from the third oxide substrate 112 by the pick-up operation and being in contact with the organic film 150 may be bonded with the h-BN insulator portion 130 formed on the first oxide substrate 110.

Accordingly, the first semiconductor portion 120, the h-BN insulator portion 130, and the second semiconductor portion 160 may be stacked on the first oxide substrate 110.

After the first semiconductor portion 120, the h-BN insulator portion 130, and the second semiconductor portion 160 are stacked, the organic film 150 that is in contact with the h-BN insulator portion 150 may be removed.

Figure 1C:
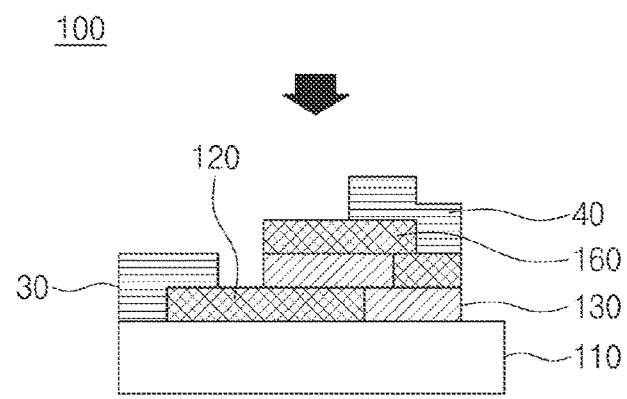
FIG. 1C is a view of the tunneling device to which a final process of the manufacturing process is applied according to an embodiment of the present disclosure.

FIG. 1C is a view of the tunneling device after a final process of the manufacturing process is completed according to an embodiment of the present disclosure.

Referring to FIG. 1C, the tunneling device 100 obtained after the processes according to the present disclosure are completed is shown.

After the process shown in FIG. 1B, the tunneling device 100 may have a structure of semiconductor/intermediate layer/semiconductor that is a basic structure of a resonant tunneling device. Then, a PR patterning process may be performed so that a metal material may be deposited where necessary, and the PR may be removed by a lift-off process after a source electrode 30 and a drain electrode 40 are formed.

Accordingly, the tunneling device 100 may be completed.

In the present embodiment, the lift-off process may be a process of removing all unnecessary PR by immersing the device in acetone.

Then, characteristics of the negative differential resistance may be checked by measuring I-V characteristics.

Figure 2:
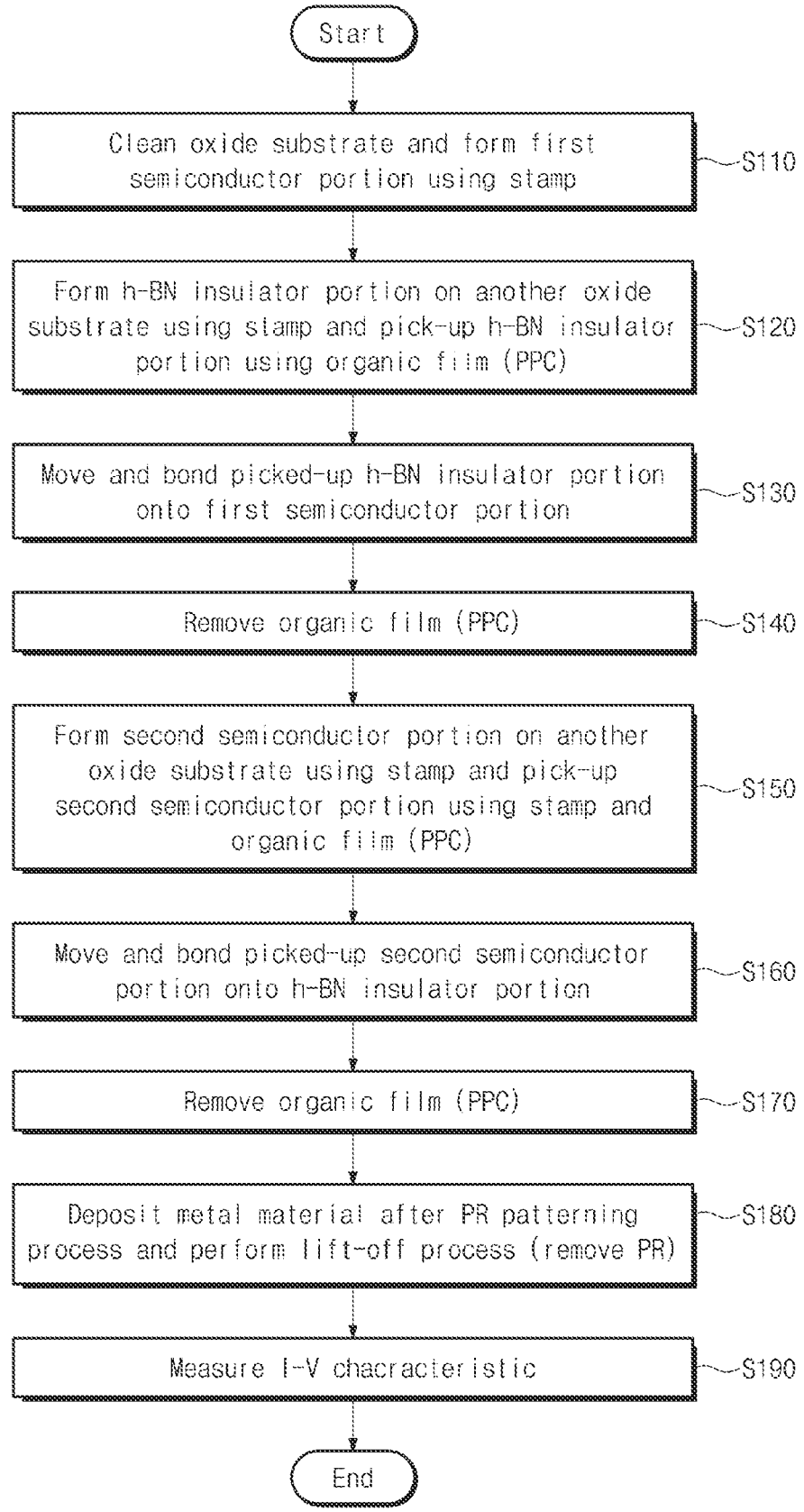
FIG. 2 is a flowchart of a method of manufacturing a tunneling device according to an embodiment of the present disclosure.

FIG. 2 is a flowchart of a method of manufacturing the tunneling device according to an embodiment of the present disclosure.

Referring to FIG. 2, in the manufacturing process of the tunneling device 100, the oxide substrates may be cleaned, and the semiconductor portion may be manufactured using the stamp (S110).

As an example, the oxide substrates containing a gate oxide such as $SiO_2$ may be cleaned, and the first semiconductor portion may be formed on the first oxide substrate using the PDMS stamp.

Then, in operation S120, the h-BN insulator portion may be manufactured on another oxide substrate using the stamp, and the h-BN insulator portion may be picked-up using the organic film.

As an example, the h-BN insulator portion may be manufactured on the second oxide substrate containing the gate oxide such as $SiO_2$, which is different from the oxide substrate in operation S110, using the PDMS stamp, and the h-BN insulator portion may be picked-up using the PPC organic film.

In operation S130, the h-BN insulator picked-up in operation S120 may move and may be bonded onto the semiconductor portion manufactured in operation S110.

The semiconductor portion and the h-BN insulator may be bonded with each other, and then the PPC organic film may be removed (S140).

In operation S150, a semiconductor portion, which is different from the semiconductor portion manufactured in operation S110, may be manufactured on an oxide substrate different from the oxide substrate in operations S110 and S120 using the stamp, and the semiconductor portion may be picked-up using the stamp and the organic film.

As an example, the second semiconductor portion may be manufactured on the third oxide substrate using the PDMS stamp, the second semiconductor portion may be picked-up using the PDMS stamp and the PPC organic film.

In operation S160, the second semiconductor portion that corresponds to the semiconductor portion picked-up in operation S150 may move and may be bonded onto the h-BN insulator.

In operation S170, the second semiconductor portion and the h-BN insulator may be bonded with each other in operation S160, and then the PPC organic film may be removed.

In operation S180, the PR patterning process may be performed on the tunneling device from which the PPC organic film is removed, the source electrode and the drain electrode may be deposited, and the lift-off process (PR removal) may be performed.

Then, in operation S190, the negative differential resistance characteristics may be checked by measuring I-V characteristics.

Figure 3A:
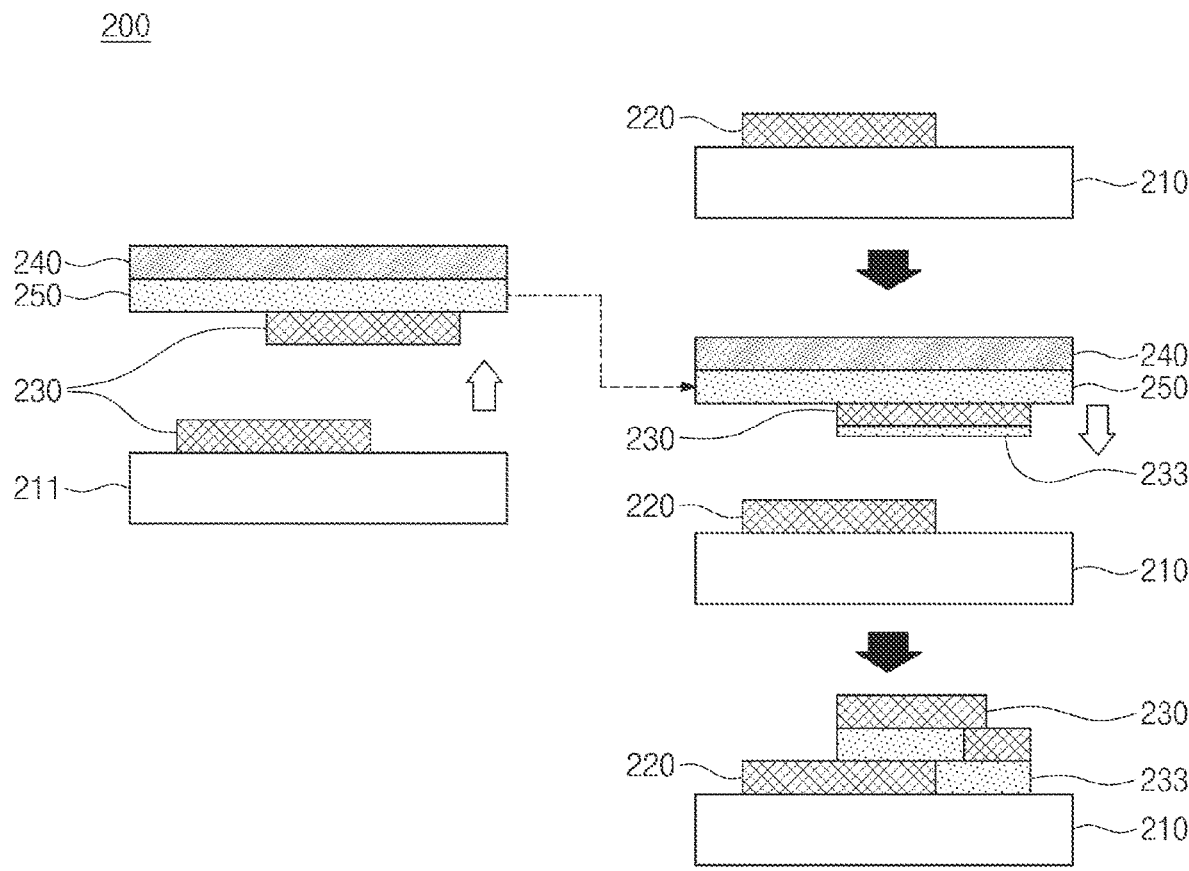
FIG. 3A is a view of a first process of a manufacturing process of a tunneling device according to an embodiment of the present disclosure.

FIG. 3A is a view of a first process of a manufacturing process of a tunneling device 200 according to an embodiment of the present disclosure.

Figure 3B:
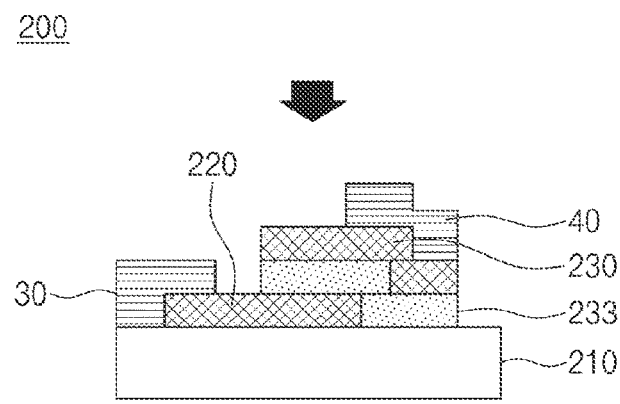
FIG. 3B is a view of the tunneling device to which a final process of the manufacturing process is applied according to an embodiment of the present disclosure.

FIG. 3B is a view of the tunneling device 200 after a final process of the manufacturing process is completed according to an embodiment of the present disclosure.

The tunneling device 200 of FIGS. 3A and 3B has similar structure and function as those of the tunneling device 100 of FIGS. 1A to 1C. In FIGS. 3A and 3B, the same and similar reference numerals denote the same and similar elements in FIGS. 1A to 1C, and thus, detailed descriptions of the same and similar elements will be omitted.

Referring to FIG. 3A, the tunneling device 200 of a first process of the manufacturing process may include a first oxide substrate 210, a second oxide substrate 211, a first semiconductor portion 220, a second semiconductor portion 230, a stamp 240, and an organic film 250.

The first oxide substrate 210 and the second oxide substrate 211 may include the same material as that of the first and second oxide substrates 110 and 111 of the tunneling device 100.

The first semiconductor portion 220 may be manufactured on the first oxide substrate 210 using the stamp 240.

In this case, the first semiconductor portion 220 may include transition metal dichalcogenide materials of an MX2 molecular structure series such as $MoS_2$, $WSe_2$, $MoTe_2$, $WS_2$, $MoSe_2$, $ReS_2$, $ReSe_2$, $WTe_2$, etc.

As an example, the first semiconductor portion 220 may be manufactured using the PDMS stamp 240 to have a heterostructure in which transition metal dichalcogenide materials that are 2D semiconductor materials spotlighted as a new semiconductor material, such as $MoS_2$, $ReS_2$, $ReSe_2$, $WS_2$, $MoTe_2$, $WSe_2$, BP, $MoSe_2$, $HfS_2$, $HfSe_2$, $ZrS_2$, $ZrSe_2$, etc., are bonded to each other. However, this is merely an example, and the present disclosure should not be limited thereto or thereby.

The second semiconductor portion 230 may be manufactured on the second oxide substrate 211 different from the first oxide substrate 210 using the stamp 240.

In this case, as the second semiconductor portion 230, a material that naturally and rapidly oxidizes may be used.

As an example, the second semiconductor portion 230 may include one of materials having a structure of $MO_x$/$MX_2$, such as $HfS_2$, $MoS_2$, BP, $HfSe_2$, $HfTe_5$, $HfTe_2$, $ZrS_2$, $ZrSe_2$, $ZrTe_2$, $ZrS_3$, $ZrS_5$, $ZrTe_3$, etc.

Accordingly, the second semiconductor portion 230 may include a natural oxide film 233 formed by natural oxidation for a predetermined time.

The natural oxide film 233 may be one surface of the second semiconductor portion 230 and may serve as an intermediate layer 233 formed between the first semiconductor portion 220 and the second semiconductor portion 230 when the manufacturing process of the tunneling device 200 is completed.

That is, the second semiconductor portion 230 may be formed of a material that quickly reacts with oxygen in air to allow an oxide film to be formed at an interface thereof, and thus may have a form of an insulator intermediate layer/2D semiconductor.

In addition, the second semiconductor portion 230 may be formed of a material that is oxidized within about 15 minutes, and thus, the manufacturing process may be dramatically reduced. As a result, a manufacturing time of the tunneling device may be shortened to be about 15 minutes or less.

The stamp 240 may be substantially the same as the stamp 140 of the tunneling device 100.

As an example, the stamp 240 of the tunneling device 200 may be the polydimethylsiloxane (PDMS) stamp.

The first semiconductor portion 220 may be manufactured on the first oxide substrate 210 of the tunneling device 200 and the second semiconductor portion 230 may be manufactured on the second oxide substrate 211 using the stamp 240.

The organic film 250 may be substantially the same as the organic film 150 of the tunneling device 100.

The organic film 250 may be a propylene carbonate (hereinafter, referred to as PPC) film and may be bonded with the PDMS stamp 240 to pick-up the first semiconductor portion 220 formed on the first oxide substrate 210 and the second semiconductor portion 230 formed on the second oxide substrate 211.

First, according to the present embodiment, the first semiconductor portion 220 may be formed on the first oxide substrate 210 using the stamp 240. In addition, the second semiconductor portion 230 may be manufactured on the second oxide substrate 211 different from the first oxide substrate 210 using the stamp 240.

Then, the second semiconductor portion 230 may be picked-up by the stamp 240 and the organic film 250.

In this case, the picked-up second semiconductor portion 230 may be separated from the second oxide substrate 211.

The second semiconductor portion 230 separated from the second oxide substrate 211 by the picked-up operation and being in contact with the organic film 250 may be naturally oxidized for a predetermined time, and thus, the natural oxide film 233 may be formed on the one surface of the second semiconductor portion 230.

The second semiconductor portion 230 on which the natural oxide film 233 is formed after the predetermined time may be bonded with the first semiconductor portion 220 formed on the first oxide substrate 210.

In this case, the first semiconductor portion 220 may be in contact with and may be bonded with the natural oxide film 233 formed on the second semiconductor portion 230, and thus, the first semiconductor portion 220, the natural oxide film 233, and the second semiconductor portion 230 may be sequentially stacked.

Accordingly, the natural oxide film 233 may be provided as the intermediate layer between the first semiconductor portion 220 and the second semiconductor portion 230.

After the first semiconductor portion 220, the natural oxide film 233, and the second semiconductor portion 230 are stacked, the organic film 250 that is in contact with the second semiconductor portion 230 may be removed.

Referring to FIG. 3B, the tunneling device 200 may include the first semiconductor portion 220 formed on the first oxide substrate 210, the second semiconductor portion 230 stacked on the first semiconductor portion 220, and the intermediate layer 233 formed between the first semiconductor portion 220 and the second semiconductor portion 230 and containing the natural oxide.

In addition, the tunneling device 200 may have a structure of semiconductor/intermediate layer/semiconductor that is a basic structure of a resonant tunneling device. Then, a PR patterning process may be performed so that a metal material may be deposited where necessary, the PR may be removed by a lift-off process after a source electrode 30 and a drain electrode 40 are deposited, and thus, the tunneling device 200 may be provided with the source electrode 30 and the drain electrode 40 stacked thereon.

That is, the manufacturing process of the tunneling device 200 may include only the first process without employing the second process of the tunneling device 100, and thus, the manufacturing time of the tunneling device may be shortened to be about 15 minutes or less.

According to the present embodiment, the process of forming the intermediate layer and the process of forming the 2D semiconductor formed thereon may be integrated into one process, and it may be possible to manufacture a high-yield and high-performance tunneling device when manufacturing tunneling devices through mass production. Accordingly, in addition to the field of the resonant tunneling device manufacturing, the present disclosure may also be applied to the development of other process technologies that require simple oxide layers, such as flash memories and synaptic devices.

FIG. 4 is a flowchart of a method of manufacturing the tunneling device according to an embodiment of the present disclosure.

Referring to FIG. 4, in the manufacturing process of the tunneling device 200, the oxide substrates may be cleaned, and the semiconductor portion may be manufactured using the stamp (S210).

As an example, the oxide substrates containing a gate oxide such as $SiO_2$ may be cleaned, and the first semiconductor portion may be formed on the first oxide substrate using the PDMS stamp.

Then, the semiconductor portion, which is easily oxidized and is different from the semiconductor portion in operation S210, may be manufactured on another oxide substrate using the stamp, and the semiconductor portion that is easily oxidized may be picked-up using the organic film (S220).

As an example, the second semiconductor portion that is easily oxidized may be manufactured on the second oxide substrate, which is different from the oxide substrate in operation S210 and contains the gate oxide such as $SiO_2$, using the PDMS stamp, and the second semiconductor portion that is easily oxidized may be picked-up using the PPC organic film (S220).

In operation S230, the picked-up semiconductor portion that is easily oxidized may be naturally oxidized for a predetermined time.

As an example, the second semiconductor portion picked-up by the PPC organic film may be naturally oxidized for the predetermined time, and thus, the natural oxide film may be formed on one surface of the second semiconductor portion.

In the present embodiment, the predetermined time may be within about 15 minutes, and the second semiconductor portion may include a material, such as $fS_2$, $MoS_2$, BP, $HfSe_2$, $HfTe_5$, $HfTe_2$, $ZrS_2$, $ZrSe_2$, $ZrTe_2$, $ZrS_3$, $ZrS_5$, $ZrTe_3$ or the like, which is easily oxidized.

In operation S240, the semiconductor portion whose one surface is naturally oxidized in operation S230 may move and may be bonded with the semiconductor portion manufactured in operation S210.

As an example, the second semiconductor portion on which the natural oxide film is formed may be bonded onto the first semiconductor portion formed on the first oxide substrate, and thus, the first semiconductor portion, the natural oxide film, and the second semiconductor portion may be stacked to allow the natural oxide film to serve as the intermediate layer.

In operation S250, the semiconductor portion and the semiconductor portion whose one surface is oxidized may be bonded with each other, and then, the PPC organic film may be removed.

In operation S260, the PR patterning process may be performed on the tunneling device from which the PPC organic film is removed, the source electrode and the drain electrode may be deposited, and the lift-off process (PR removal) may be performed.

Then, in operation S270, the negative differential resistance characteristics of the tunneling device may be checked by measuring I-V characteristics (S270).

In the manufacturing process of the tunneling device 200 according to the present disclosure, a conventionally used artificial process of forming the intermediate layer may be omitted, and the integrated intermediate layer may be formed by bonding an upper 2D semiconductor material, which is in the form of the naturally oxidized layer/2D semiconductor, with a lower 2D semiconductor material.

Due to the above advantages of the present disclosure, time consumed for the conventional process may be dramatically reduced from about 3 hours to about 1 day or more to about 15 minutes.

In addition, when compared with a technique that deposits the high-k materials such as $HfO_2$, $Al_2O_3$, HZO, $Y_2O_3$, hBN, $TiO_2$, and $ZrO_2$ and the insulators such as $SiO_2$ as the intermediate layer at high vacuum and high temperature for a long time using known equipment such as an ALD, a sputter, an e-beam evaporator, etc., the present disclosure may provide a highly efficient process that may be performed at an environment where high vacuum is not required and at a remarkably low temperature in a simple air environment for about 15 minutes.

Further, it takes about 5 hours to about 1 day to form the intermediate layer through the intermediate layer deposition method using a vacuum equipment, whereas the present disclosure may provide the process in which the resonant tunneling device is manufactured in a very short time within about 15 minutes.

Figure 5:
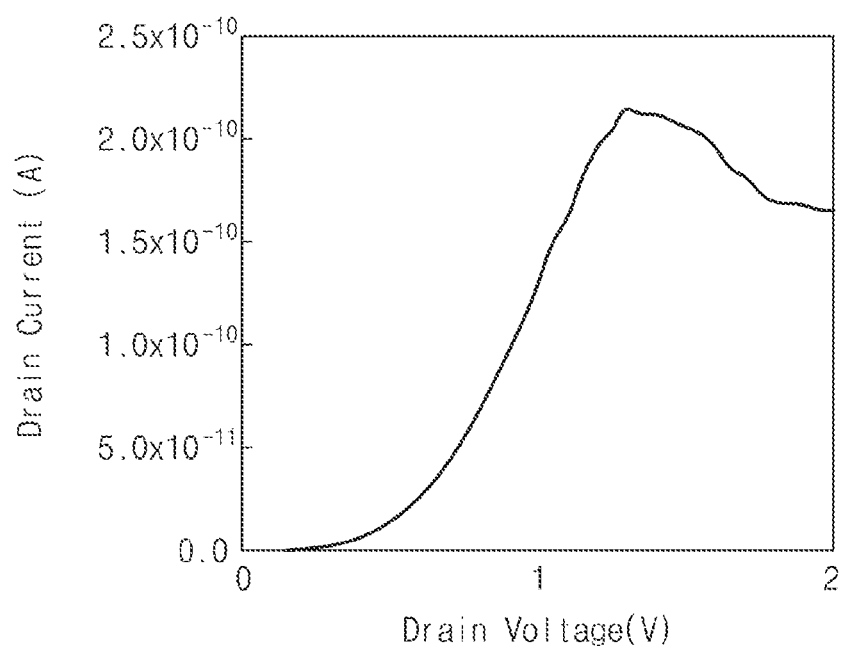
FIG. 5 is a graph of results according to a manufacturing method of a tunneling device according to an embodiment of the present disclosure.

FIG. 5 is a graph of results according to the manufacturing process of the tunneling device according to an embodiment of the present disclosure.

Referring to the graph of FIG. 5, it may be observed that the tunneling device manufactured through the processes according to the present embodiment of the present disclosure has negative differential resistance characteristics by manufacturing the 2D semiconductor/intermediate layer/2D semiconductor structure through the process of bonding the 2D semiconductor in which the natural oxide film is formed with the 2D semiconductor.

However, this is merely an example, and the 2D semiconductor of the present disclosure may be replaced with a three-dimensional (3D) semiconductor.

Accordingly, the present disclosure may be applied to the production of an actual resonant tunneling device.

That is, the method of manufacturing the tunneling device according to the present disclosure may be a technology in which the number of processes is reduced to minimize defects on interface when being applied to a mass production technology.

The present disclosure relates to a technology to improve the manufacturing process of the resonant tunneling device, and thus, the process efficiency may be greatly increased when multiple logic devices are manufactured.

The present disclosure provides a method using a structure of the naturally oxidized oxide layer/2D semiconductor, and the technology of the present disclosure may be applied to various fields such as a flash memory, a synaptic device, and multiple logic devices as well as the fabrication of the tunneling device.

Although the embodiments of the present disclosure have been described, it is understood that the present disclosure should not be limited to these embodiments but various changes and modifications can be made by one ordinary skilled in the art within the spirit and scope of the present disclosure as hereinafter claimed. Therefore, the disclosed subject matter should not be limited to any single embodiment described herein, and the scope of the present inventive concept shall be determined according to the attached claims.

What is claimed is:

1. A tunneling device comprising:
an oxide substrate;
a first semiconductor portion disposed on the oxide substrate;
a source electrode disposed on the oxide substrate and in contact with the first semiconductor portion;
a second semiconductor portion disposed on the first semiconductor portion;
an intermediate layer disposed between the first semiconductor portion and second semiconductor portion; and
a drain electrode disposed on the second semiconductor portion,
wherein the intermediate layer is a film of h-BN,
wherein the second semiconductor portion comprises a material selected from the group consisting of $MoS_2$, $WSe_2$, $MoTe_2$, $WS_2$, $MoSe_2$, $ReS_2$, $ReSe_2$, $HfS_2$, BP, and $WTe_2$,
wherein the intermediate layer has a thickness between about 1 nanometer and about 2 nanometers,
wherein the first semiconductor portion is formed on the oxide substrate using a stamp, and the second semiconductor portion is stacked on the first semiconductor portion using the stamp and an organic film while being disposed on a second oxide substrate different from the first oxide substrate,
wherein the first semiconductor portion comprises transition metal dichalcogenide materials selected from the group consisting of $MoS_2$, $MoTe_2$, $WS_2$, $MoSe_2$, $ReS_2$, $ReSe_2$, and $WTe_2$, and
wherein the second semiconductor portion is separated from the oxide substrate by the intermediate layer.

2. The tunneling device of claim 1, wherein the stamp is a polydimethylsiloxane (PDMS), and the organic film is a propylene carbonate (PPC).

* * * * *